(12) United States Patent
Fukui

(10) Patent No.: US 8,455,892 B2
(45) Date of Patent: Jun. 4, 2013

(54) LED MODULE AND LED LIGHTING DEVICE

(75) Inventor: Hiroyuki Fukui, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 59 days.

(21) Appl. No.: 13/160,148

(22) Filed: Jun. 14, 2011

(65) Prior Publication Data

US 2011/0316014 A1 Dec. 29, 2011

(30) Foreign Application Priority Data

Jun. 29, 2010 (JP) ................................ 2010-147348

(51) Int. Cl.
 *H01L 29/20* (2006.01)
(52) U.S. Cl.
 USPC ..................................... 257/89; 257/E33.075
(58) Field of Classification Search
 USPC ............................................ 257/89, E33.075
 See application file for complete search history.

(56) References Cited

U.S. PATENT DOCUMENTS

| 7,592,695 | B2 * | 9/2009 | Reis et al. ...................... 257/706 |
| 7,682,048 | B2 * | 3/2010 | Hsu et al. ...................... 362/294 |
| 7,906,793 | B2 * | 3/2011 | Negley ............................ 257/98 |
| 2009/0161354 | A1 * | 6/2009 | Hsu et al. ...................... 362/227 |
| 2009/0321749 | A1 * | 12/2009 | Peiler .............................. 257/79 |

FOREIGN PATENT DOCUMENTS

JP 2002-314146 10/2002

* cited by examiner

*Primary Examiner* — Lex Malsawma

(74) *Attorney, Agent, or Firm* — Hamre, Schumann, Mueller & Larson, P.C.

(57) ABSTRACT

An LED module includes a substrate including a main surface and a rear surface that are opposed to each other. The LED module also includes a plurality of LED chips arranged on the main surface, a drive circuit chip that is provided on the substrate and that is provided for driving the plurality of LED chips, a first heat dissipater that is provided on the rear surface and that overlaps the plurality of LED chips as viewed in the thickness direction of the substrate, and a second heat dissipator that is provided at a position closer to the drive circuit chip than the first heat dissipater is. The second head dissipater has a thickness greater than that of the first heat dissipater. The LED module emits a uniform amount of light and color.

15 Claims, 12 Drawing Sheets

LED MODULE AND LED LIGHTING DEVICE

BACKGROUND OF THE INVENTION

1. Field of the Invention

The present invention relates to an LED module and an LED lighting device.

2. Description of the Related Art

FIG. 23 shows an example of a conventional LED module (see, for example, JP 2002-314136A). An LED module 900 shown in FIG. 23 includes a wiring board 100, a plurality of LED chips 200, a drive IC 300 and a heat dissipation plate 400. The heat dissipation plate 400 is made of a material having excellent thermal conductivity and has an elongated plate shape. The wiring board 100 is provided at each longitudinal end of the underside of the heat dissipation plate 400. The LED chips 200 are provided in a region extending from the longitudinal midway portion of the surface of the heat dissipation plate 400 to a position toward each longitudinal end, and aligned in the longitudinal direction of the heat dissipation plate 400. The drive IC 300 has a constant voltage circuit, a light modulation circuit and the like, and is provided at the longitudinal midway portion of the underside of the heat dissipation plate 400. The LED chips 200 are driven and controlled by the drive IC 300 and emit light upward. The heat dissipation plate 400 dissipates heat generated during operation of the LED chips 200 and the drive IC 300 to the outside.

In the LED module 900, the LED chips 200 and the drive IC 300 are arranged so as to overlap at the longitudinal midway portion of the heat dissipation plate 400. Accordingly, the temperature near the midway portion of the heat dissipation plate 400 tends to be higher than that near the ends. The LED chips 200 are more likely to emit a reduced amount of light or modulated color light as the temperature increases. Therefore, in the LED module 900, there is a possibility that variations might occur in the amount of light and color in the longitudinal direction.

SUMMARY OF THE INVENTION

The present invention has been proposed under the circumstances descried above. It is an object of the present invention to provide an LED module and an LED lighting device that can emit a uniform amount of light and color.

An LED module provided according to a first aspect of the present invention includes: a substrate including a main surface and a rear surface that are opposed to each other; a plurality of LED chips arranged on the main surface of the substrate; a drive circuit chip that is provided on the substrate and that is provided for driving the plurality of LED chips; a first heat dissipator that is provided on the rear surface of the substrate and that overlaps the plurality of LED chips as viewed in a thickness direction of the substrate; and a second heat dissipator that is provided at a position closer to the drive circuit chip than the first heat dissipator is, and that has a thickness greater than that of the first heat dissipator.

An LED module provided according to a second aspect of the present invention is the LED module provided according to the first aspect of the present invention, wherein the drive circuit chip is arranged on the main surface of the substrate, and the second heat dissipator is provided on the rear surface of the substrate, and overlaps the drive circuit chip as viewed in the thickness direction of the substrate.

An LED module provided according to a third aspect of the present invention is the LED module provided according to the second aspect of the present invention, wherein the first and second heat dissipators are spaced apart from each other.

An LED module provided according to a fourth aspect of the present invention is the LED module provided according to the second aspect of the present invention, wherein the first and second heat dissipators are continuous with each other.

An LED module provided according to a fifth aspect of the present invention is the LED module provided according to any one of the second to fourth aspects of the present invention, wherein a wiring pattern for connecting the plurality of LED chips and the drive circuit chip to each other is formed on the main surface of the substrate, a through-hole wiring connected to the wiring pattern is formed in the substrate, a metal layer connected to the through-hole wiring is formed on the rear surface of the substrate, and the second heat dissipator is in contact with the metal layer.

An LED module provided according to a sixth aspect of the present invention is the LED module provided according to any one of the second to fourth aspects of the present invention, wherein a wiring pattern for connecting the plurality of LED chips and the drive circuit chip to each other is formed on the main surface of the substrate, and the wiring pattern has a waist portion formed between the plurality of LED chips and the drive circuit chip.

An LED module provided according to a seventh aspect of the present invention is the LED module provided according to the first aspect of the present invention, wherein the drive circuit chip is arranged on the rear surface of the substrate, and the second heat dissipator is arranged on the rear surface of the substrate and is adjacent to the drive circuit chip.

An LED module provided according to an eighth aspect of the present invention is the LED module provided according to the first aspect of the present invention, wherein the drive circuit chip is arranged on the rear surface of, the substrate, and the second heat dissipator is arranged on the rear surface of the substrate and has a shape surrounding the drive circuit chip.

An LED module provided according to a ninth aspect of the present invention is the LED module provided according to any one of the first to eighth aspects of the present invention, wherein the closer a portion of the first heat dissipator is to the second heat dissipator, the greater the thickness of the portion is.

An LED module provided according to a tenth aspect of the present invention is the LED module provided according to any one of the first to ninth aspects of the present invention, wherein the first and second heat dissipators have a slit formed in the thickness direction of the substrate, and the slit of the second heat dissipator is deeper than the slit of the first heat dissipator.

An LED module provided according to an eleventh aspect of the present invention is the LED module provided according to any one of the first to tenth aspects of the present invention, wherein the substrate has a strip shape, and the drive circuit chip is arranged toward one end in a longitudinal direction of the substrate.

An LED module provided according to a twelfth aspect, of the present invention is the LED module provided according to the eleventh aspect of the present invention, wherein the plurality of LED chips are aligned in the longitudinal direction, of the substrate.

An LED module provided according to a thirteenth aspect of the present invention is the LED module provided according to the eleventh or twelfth aspect of the present invention, wherein the LED chips emit white light.

An LED module provided according to a fourteenth aspect of the present invention is the LED module provided according to any one of the first to tenth aspects of the present invention, wherein the plurality of LED chips constitute a plurality of LED chip groups, each consisting of an LED chip that emits red light, an LED chip that emits green light and an LED chip that emits blue light.

An LED module provided according to a fifteenth aspect of the present invention is the LED module provided according to the fourteenth aspect of the present invention, wherein the substrate has a rectangular shape, and the plurality of LED chip groups are arranged in a matrix.

An LED module provided according to a sixteenth aspect of the present invention is the LED module provided according to the fifteenth aspect of the present invention, wherein in the LED chip groups adjacent to each other, a relative positional relationship between the LED chips that emit red light, green light and blue light is different.

An LED lighting device provided according to a seventeenth aspect of the present invention includes a plurality of the LED modules provided according to any one of the first to sixteenth aspects of the present invention, wherein the drive circuit chips provided in the LED modules are arranged in a row within the same plane.

Other features and advantages of the present invention will become apparent in descriptions of embodiments of the present invention provided below.

DETAILED DESCRIPTION OF THE PREFERRED EMBODIMENTS

FIGS. 1 to 4 show an LED module according to a first embodiment of the present invention. An LED module A1 according to the present embodiment includes, a substrate 1, a plurality of light emitting units 2, a drive circuit chip 3, and first and second heat dissipators 4 and 5.

Figure 2:
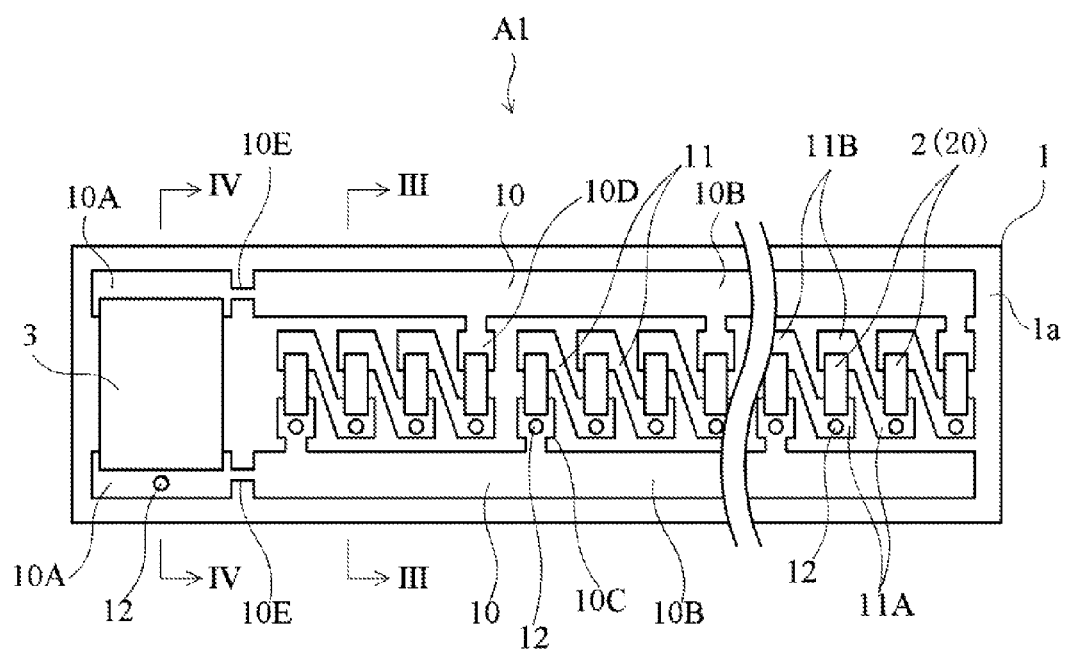
FIG. 2 is a plan view of the LED module shown in FIG. 1.

The substrate 1 can be made of, for example, glass epoxy, and formed in a strip shape. The substrate 1 has a main surface 1a and a rear surface 1b. As shown in FIG. 2, on the main surface 1a, a plurality of first wiring patterns 10 and a plurality of second wiring patterns 11 are formed.

The first wiring patterns 10 are, two mutually insulated conductive films. Each first wiring pattern 10 includes a first bonding pad portion 10A, an extension portion 10B, second bonding pad portions 10C or 10D, and a waist portion 10E. The first bonding pad portion 10A is positioned at one longitudinal end of the main surface 1a. The extension portion 10B is positioned toward a transverse end of the main surface 1a, and extends in the longitudinal direction of the main surface 1a. A plurality of second bonding pad portions 10C or 10D are aligned in the longitudinal direction of the main surface 1a, each second bonding pad portion protruding from the extension portion 10B toward the midway portion of the main surface 1a. The second bonding pad portions 10C of one first wiring pattern 10 and the second bonding pad portions 10D of the other first wiring pattern 10 are spaced apart from each other in the longitudinal direction of the main surface 1a. The waist portion 10E is positioned between the first bonding pad portion 10A and the extension portion 10B. The waist portion 10E has a width smaller than that of the first bonding pad portion 10A and the extension portion 10B.

The second wiring patterns 11 are a number of mutually insulated conductive films. The second wiring patterns 11 are formed between the extension portion 10B of one first wiring pattern 10 and the extension portion 10B of the other first wiring pattern 10. In the present embodiment, as an example, the second wiring patterns 11 are aligned in the longitudinal direction of the main surface 1a so as to form groups, each consisting of three. Each second wiring pattern 11 extends obliquely with respect to the transverse direction of the main surface 1a. The ends of each second wiring pattern 11 are used as bonding pad portions 11A and 11B. A plurality of bonding pad portions 11A are aligned in the longitudinal direction of the main surface 1a so as to form a line together with the second bonding pad portions 10C of one first wiring pattern 10. The bonding pad portions 11A are divided into sections, each consisting of three, by the second bonding pad portions 10C. A plurality of bonding pad portions 11B are aligned in the longitudinal direction of the main surface 1a so as to form a line together with the second bonding pad portions 10D of the other first wiring pattern 10. The bonding pad portions 11B are also divided into sections, each consisting of three, by the second bonding pad portions 10D.

Figure 1:
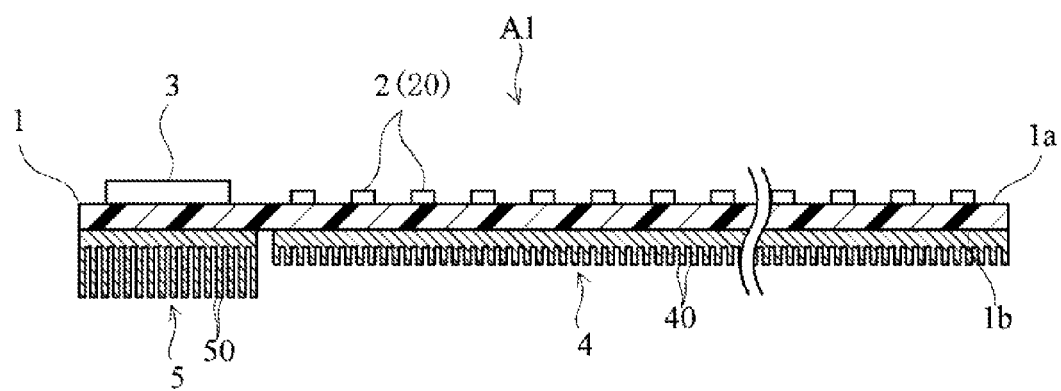
FIG. 1 is a cross-sectional view of an LED module according to a first embodiment of the present invention.
Figure 3:
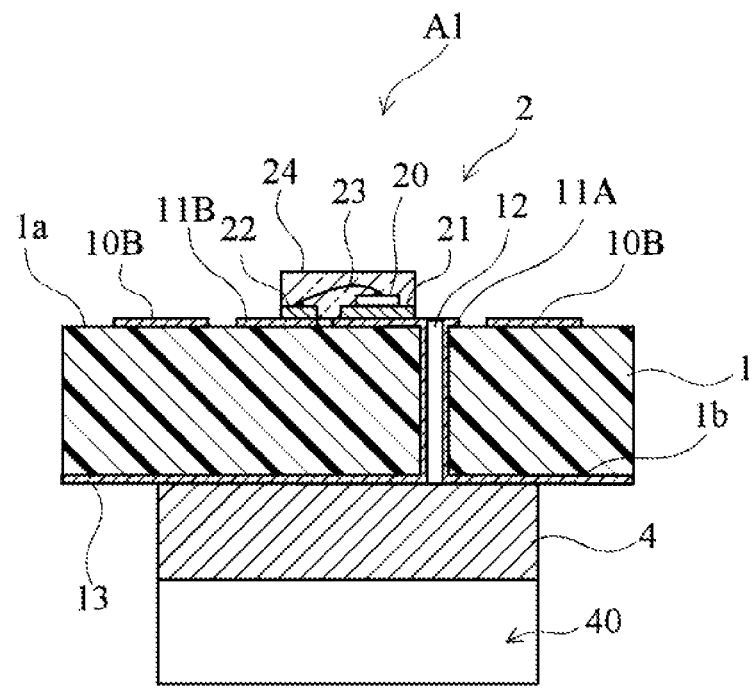
FIG. 3 is a cross-sectional view taken along the line III-III shown in FIG. 2.
Figure 4:
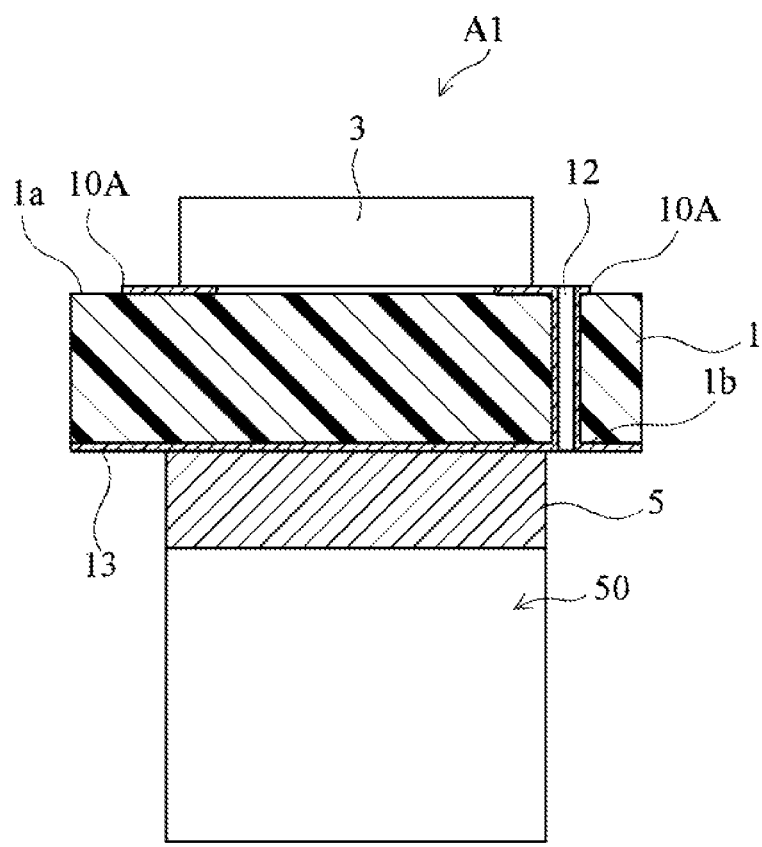
FIG. 4 is a cross-sectional view taken along the line IV-IV shown in FIG. 2.

Through-hole wirings 12 are formed at positions overlapping the bonding pad portions 10A and 10C of one first wiring pattern 10. Through-hole wirings 12 are also formed at positions overlapping the bonding pad portions 11A of the second wiring patterns 11. As shown in FIGS. 3 and 4, each through-hole wiring 12 passes through the substrate 1 in the thickness direction to the rear surface 1b. A metal layer 13 connected to the through-hole wiring 12 is formed on the entire rear surface 1b of the substrate 1. In FIG. 1, the first and second wiring patterns 10 and 11, the through-hole wirings 12 and the metal layer 13 are not illustrated.

As shown in FIG. 2, the light emitting units 2 are aligned in the longitudinal direction of the substrate 1, and bonded to the bonding pad portions 10C or 10D, 11A and 11B of the first and second wiring patterns 10 and 11. In the present embodiment, a plurality of series circuits are formed, each consisting of a group of four light emitting units 2, by connecting four light emitting units 2 in series via the second wiring patterns 11. The light emitting units 2 positioned at the ends of each of the series circuits are connected to mutually different banding pad portions 10C and 10D of the first wiring patterns 10. A parallel circuit is thereby formed in which the series circuits are connected in parallel.

As shown in FIG. 3, a light emitting unit 2 includes an LED chip 20, mutually spaced-apart metal leads 21 and 22, a wire 23, and a resin package 24. The light emitting unit 2 including an LED chip 20 is more likely to emit a reduced amount of light or modulated color light as the temperature increases.

The LED chip 20 has a structure in which, for example, an n-type semiconductor layer, a p-type semiconductor layer and an active layer interposed therebetween are stacked. The LED chip 20 emits blue light when it is made of, for example, a GaN-based semiconductor. The LED chip 20 is mounted on the lead 21. The upper surface of the LED chip 20 is connected to the lead 22 via the wire 23. The lead 21 is bonded to the bonding pad portion 10C of the first wiring pattern 10 or the bonding pad portion 11A of the second wiring pattern 11. In the present embodiment, the bonding pad portion 11A is formed in a region extending from the through-hole wiring 12 to a position immediately below the LED chip 20. Such a configuration is advantageous in that heat from the LED chip 20 can be easily conducted to the bonding pad portion 11A. The lead 22 is bonded to the bonding pad portion 10D of the first wiring pattern 10 or the bonding pad portion 11B of the second wiring pattern 11. The resin package 24 is provided to protect the LED chip 20 and the wire 23. The resin package 24 can be made of, for example, an epoxy resin capable of transmitting light from the LED chip 20. The resin package 24 contains, for example, a fluorescent material that emits yellow light when excited by blue light. Accordingly, the light emitting unit 2 emits white light.

The drive circuit chip 3 is capable of supplying a drive voltage to the LED chips 20 and performing light modulation of the LED chips 20 by a PWM method. A light modulation circuit utilizing the switching action of a transistor has been incorporated in the drive circuit chip 3. As shown in FIG. 2, the drive circuit, chip 3 is arranged toward one longitudinal end of the main surface 1a, and, for example, bonded to the bonding pad portions 10A of the first wiring patterns 10 by a surface mount method. Thus, the drive circuit chip 3 supplies a drive voltage to the LED chips 20 through the first and second wiring patterns 10 and 11. The surface of the drive circuit chip 3 may be painted white. This configuration allows efficient emission of light from the light emitting units 2 to the outside of the LED module A1.

The first heat dissipator 4 can be, for example, an aluminum heat sink. As shown in FIGS. 1 and 3, the first heat dissipator 4 is bonded to the rear surface 1b of the substrate 1 via the metal layer 13, and provided at a position overlapping the light emitting units 2 as viewed in the thickness direction of the substrate 1. In the first heat dissipator 4, slits 40 extending in the thickness direction of the substrate 1 are formed.

The second heat dissipator 5 can be, for example, an aluminum heat sink. As shown in FIGS. 1 and 4, the second heat dissipator 5 is bonded to the rear surface 1b of the substrate 1 via the metal layer 13, and provided at a position overlapping the drive circuit chip 3 as viewed in the thickness direction of the substrate 1. The second heat dissipator 5 is formed to have a thickness greater than that of the first heat dissipator 4. The second heat dissipator 5 is spaced apart from the first heat dissipator 4 in the longitudinal direction of the substrate 1. In the second heat dissipator 5, slits 50 extending in the thickness direction of the substrate 1 are formed. The slits 50 of the second heat dissipator 5 have a depth greater than that of the slits 40 of the first heat dissipator 4.

Figure 6:
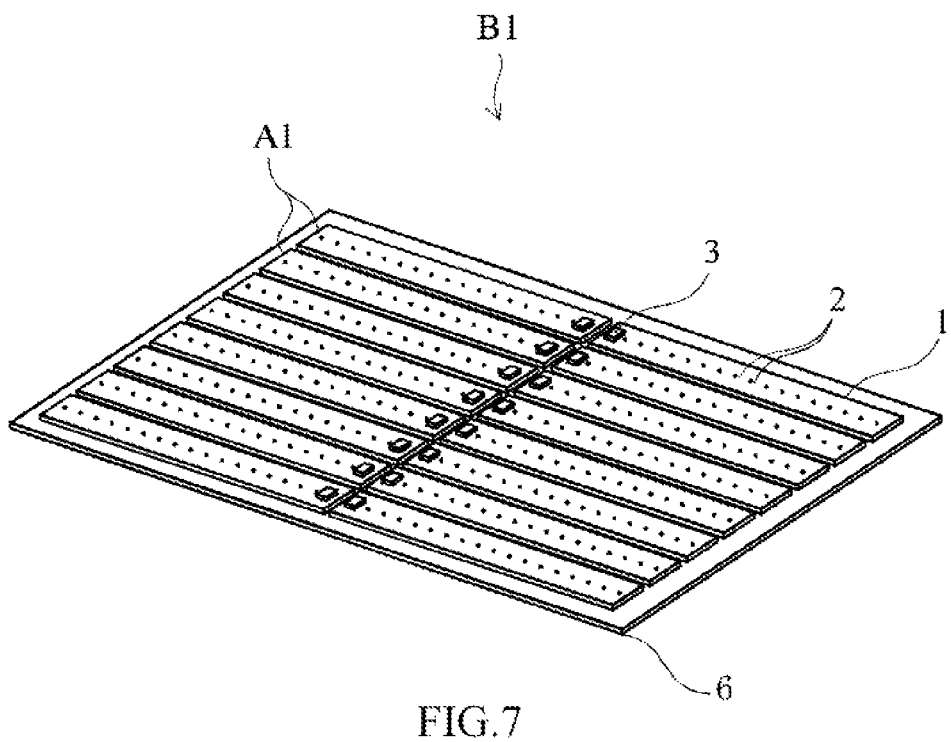
FIG. 6 is a perspective view of an LED lighting device including a plurality of the LED modules shown in FIG. 1.
Figure 7:
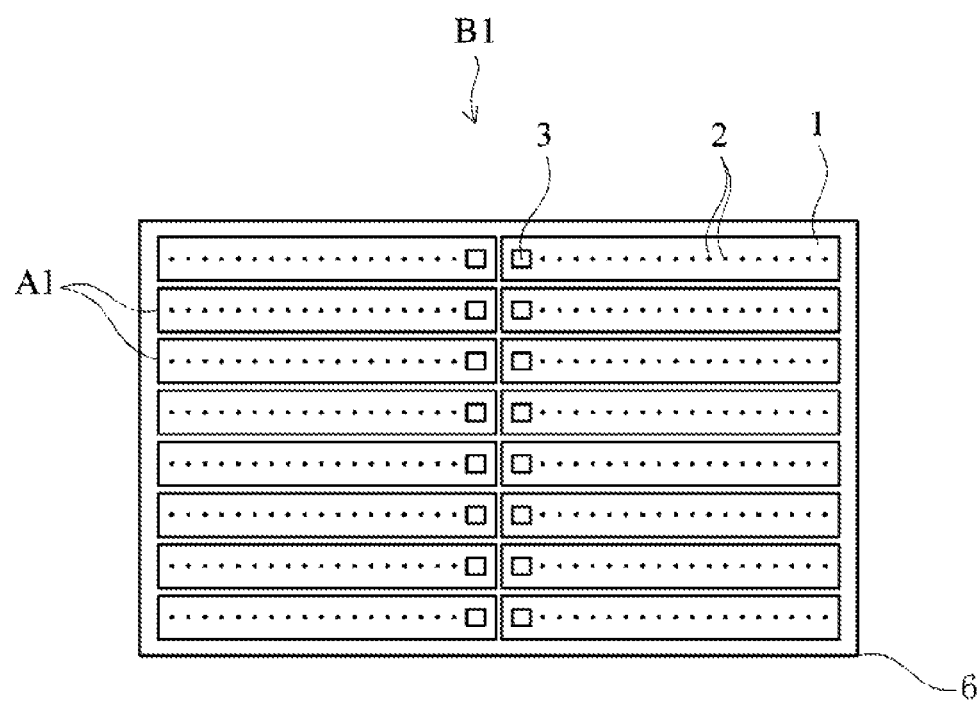
FIG. 7 is a plan view of the LED lighting device, shown in FIG. 6.

FIGS. 6 and 7 show an example of an LED lighting device including a plurality of LED modules A1. The LED lighting device B1 shown in FIGS. 6 and 7 includes a plurality of LED modules A1 and an elongated rectangular frame 6. The LED modules A1 are supported by the frame 6, and arranged in the same plane. The LED modules A1 are aligned vertically and horizontally in the frame 6. The drive circuit chips 3 of the LED modules A1 are aligned in the midway portion of the frame 6. A plurality of openings (not shown) are provided in the frame 6. The first and second heat dissipators 4 and 5 of the LED modules A1 are fitted into these openings. Thus, the first and second heat dissipators 4 and 5 are exposed at the underside of the frame 6. The LED lighting device B1 as described above serves as an area light source that emits light over the entire surface of the frame 6, and can be used as, for example, a backlight of a liquid crystal display apparatus.

Figure 5:
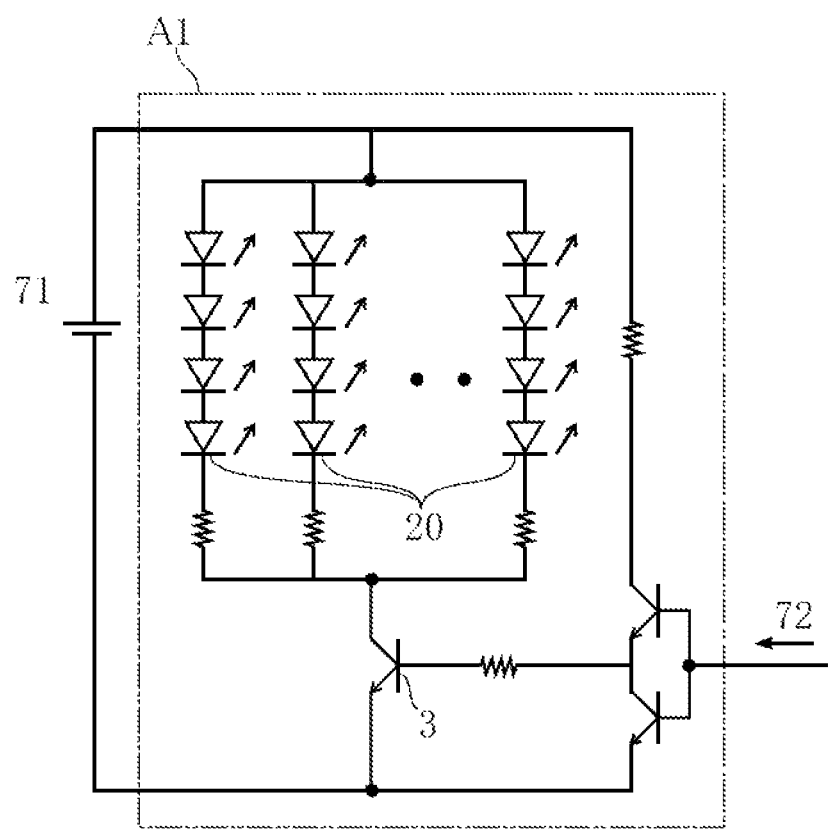
FIG. 5 is a circuit diagram of the LED module shown in FIG. 1.

As shown in FIG. 5, in the present embodiment, a plurality of series circuits, each consisting of four LED chips 20 connected to each other in series, are connected to each other in parallel. A power source 71 supplies power to the LED module A1. In the case where four LED chips 20 are connected in series, the power source 71 supplies approximately 15 V DC power. For example, a PWM light modulation signal 72 is input into the drive circuit chip 3. The drive circuit chip 3 performs a switching function for light modulation according to the light modulation signal 72. As can be seen from the diagram, the LED modules A1 has a relatively simple circuit configuration.

The action of an LED module A1 will be described next.

In the LED module A1, the drive circuit chip 3 also generates heat due to light emission of the light emitting units 2. Heat generated in the light emitting units 2 is efficiently conducted to the first heat dissipator 4 through the second bonding pad portions 10C, the bonding pad portions 11A, the through-hole wirings 12, and the metal layer 13. On the other hand, heat generated in the drive circuit chip 3 is efficiently conducted to the second heat dissipator 5 through the first bonding pad portions 10A, the through-hole wirings 12, and the metal layer 13.

The drive circuit chip 3 generates a large amount of heat due to the switching operation of the built-in light modulation circuit, and therefore the amount of heat generation is significantly larger than that of the light emitting units 2. Accordingly, more heat is conducted to the second heat dissipator 5 than to the first heat dissipator 4. The second heat dissipator 5 has a thickness greater than that of the first heat dissipator 4, and thus has an excellent heat dissipation effect. Therefore, even the drive circuit chip 3 having a large amount of heat generation can be cooled rapidly by the second heat dissipator 5. Accordingly, in the LED module A1, the temperature increase around the drive circuit chip 3 is efficiently suppressed, and thus the light emitting units 2 positioned close to the drive circuit chip 3 will not undergo a significant temperature increase.

The first and second heat dissipators 4 and 5 are spaced apart from each other in the longitudinal direction of the substrate 1. Therefore, even when the second heat dissipator 5 reaches a high temperature, for example, transfer of heat from the second heat dissipator 5 to the first heat dissipator 4 is obstructed. This configuration also effectively prevents the temperature increase of the light emitting units 2 positioned close to the drive circuit chip 3.

The first and second heat dissipators 4 and 5 have a large amount of surface area that comes in contact with the air because of the slits 40 and 50. With this configuration, the first and second heat dissipators 4 and 5 efficiently dissipate the conducted heat into the air. In particular, the slits 50 of the second heat dissipator 5 are formed deeper than the slits 40 of the first heat dissipator 4. Accordingly, the second heat dissipator 5 can exhibit a higher heat dissipation effect than the first heat dissipator 4, and thus dissipate heat rapidly.

The waist portion 10E is provided in the first wiring pattern 10 connecting the drive circuit chip 3 and the light emitting units 2. With this configuration, heat from the drive circuit chip 3 is not easily conducted to the light emitting units 2 through the first wiring pattern 10. This configuration is also effective to prevent the temperature increase of the light emitting units 2 close to the drive circuit chip 3.

Accordingly, in the LED module A1 of the present embodiment, the light emitting units 2 close to the drive circuit chip 3 will not be inappropriately heated, and thus there is no risk of the occurrence of a significant temperature difference in a plurality of light emitting units 2 aligned in the longitudinal direction of the substrate 1. Therefore, the LED modules A1 can emit light having an amount of light and a color that are uniform in the longitudinal direction of the substrate 1, without causing local degradation of the optical characteristics of the light emitting units 2.

The LED lighting device B1 has a plurality of LED modules A1 arranged in the same plane of the frame 6, whereby it is possible to emit light having a uniform amount of light and color over the entire frame 6. Therefore, the LED lighting device B1 can be used as a backlight capable of light modulation control and providing uniform brightness.

FIGS. 8 to 11 show LED modules according to second to sixth embodiments of the present invention. In the LED modules of the second to sixth embodiments, constituent components that are the same as or similar to those of the first embodiment are given the same reference numerals, and descriptions thereof are omitted here.

Figure 8:
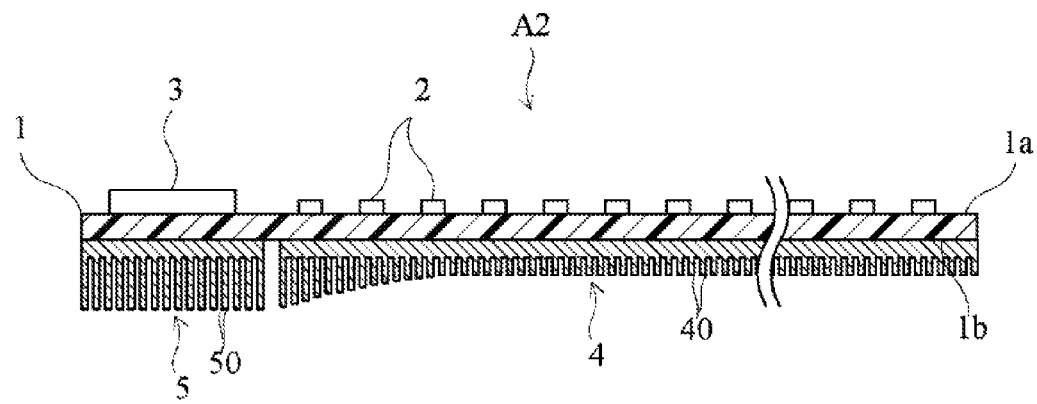
FIG. 8 is a cross-sectional view of an LED module according to a second embodiment of the present invention.

FIG. 8 shows an LED module according to a second embodiment of the present invention. In an LED module A2 of the present embodiment, the first heat dissipator 4 is formed such that the closer a portion thereof is to the second heat dissipator 5, the greater the thickness of the portion is. The slits 40 of the first heat dissipator 4 are formed such that the closer to the second heat dissipator 5, the deeper the slits 40 are. With this configuration, the closer a light emitting unit 2 is to the drive circuit chip 3, the greater the cooling action is according to the thickness of the first heat dissipator 4 and the depth of the slits 40. It is therefore possible to suppress the situation in which the closer a light emitting unit 2 is to the drive circuit chip 3 in the longitudinal direction of the substrate 1, the higher the temperature thereof rises. Accordingly, the LED module A2 can emit light having an amount of light and a color that are more uniform along the longitudinal direction of the substrate 1.

Figure 9:
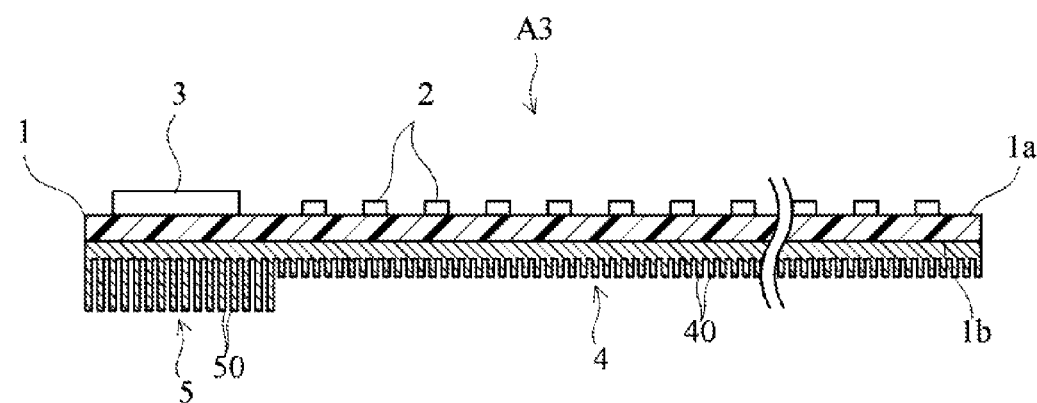
FIG. 9 is a cross-sectional view of an LED module according to a third embodiment of the present invention.

FIG. 9 shows an LED module according to a third embodiment of the present invention. In an LED module A3 of the present embodiment, the first and second heat dissipators 4 and 5 are formed in one continuous piece. With this configuration as well, the LED module A3 can emit light having a uniform light amount and color, and the number of components can be reduced.

Figure 10:
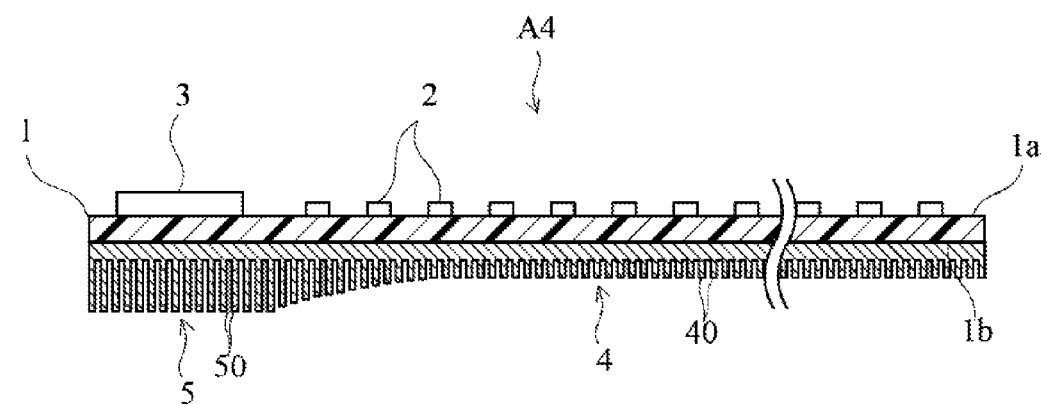
FIG. 10 is a cross-sectional view of an LED module according to a fourth embodiment of the present invention.

FIG. 10 shows an LED module according to a fourth embodiment of the present invention. In an LED module A4 of the present embodiment, the first and second heat dissipators 4 and 5 are formed in one continuous piece. Also, the first heat dissipator 4 is formed such that the closer a portion thereof is to the second heat dissipator 5, the greater the thickness of the portion is. The slits 40 of the first heat dissipator 4 are formed such that the closer to the second heat dissipator 5, the deeper the slits 40 are. With this configuration as well, the LED module A4 can emit light having a uniform light amount and color, and the number of components can be reduced.

Figure 11:
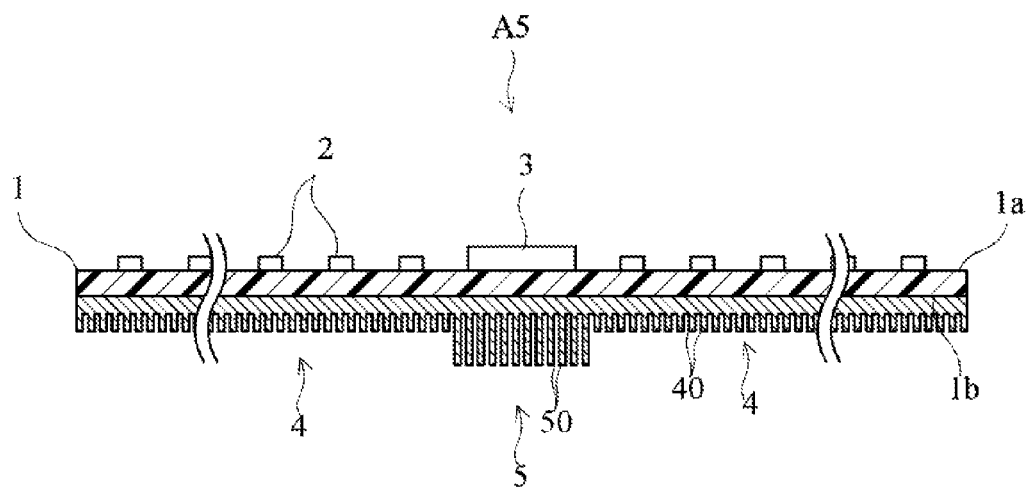
FIG. 11 is a cross-sectional view of an LED module according to a fifth embodiment of the present invention.

FIG. 11 shows an LED module according to a fifth embodiment of the present invention. In an LED module A5 of the present embodiment, the drive circuit chip 3 is arranged in the longitudinal midway portion of the main surface 1a of the substrate 1, and the light emitting units 2 are arranged equidistantly in a region extending between two longitudinal ends, excluding the region in which the drive circuit chip 3 is arranged. The second heat dissipator 5 is arranged in the longitudinal midway portion of the rear surface 1b of the substrate 1 so as to overlap the drive circuit chip 3 as viewed in the thickness direction of the substrate 1. The first heat dissipator 4 is arranged in regions each including a longitudinal end of the rear surface 1b of the substrate 1 so as to overlap the light emitting units 2 as viewed in the thickness direction of the substrate 1. The first and second heat dissipators 4 and 5 are formed in one continuous piece. With this configuration as well, the LED module A5 can emit light having a uniform light amount and color, and the number of components can be reduced.

Figure 12:
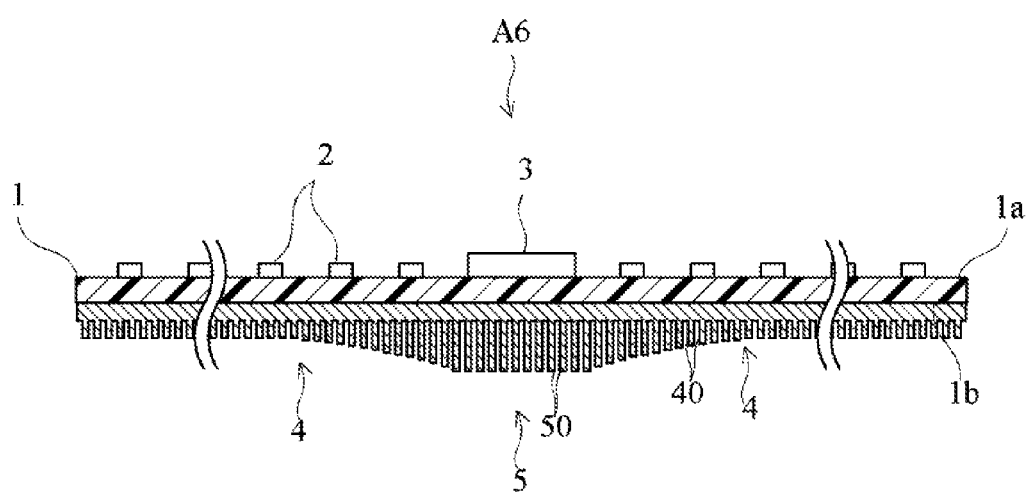
FIG. 12 is a cross-sectional view of an LED module according to a sixth embodiment of the present invention.

FIG. 12 shows an LED module according to a sixth embodiment of the present invention. An LED module A6 of the present embodiment is different from the LED module A5 described above in that the first heat dissipator 4 is formed such that the closer a portion thereof is to the second heat dissipator 5, the greater the thickness of the portion is. Also, the slits 40 of the first heat dissipator 4 are formed such that the closer to the second heat dissipator 5, the deeper the slits 40 are. With this configuration as well, the LED module A6 can emit light having a uniform light amount and color, and the number of components can be reduced.

Figure 13:
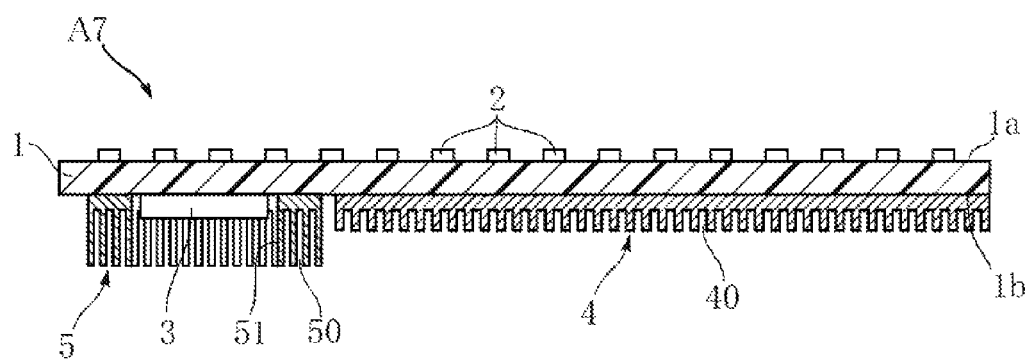
FIG. 13 is a cross-sectional view of an LED module according to a seventh embodiment of the present invention.
Figure 14:
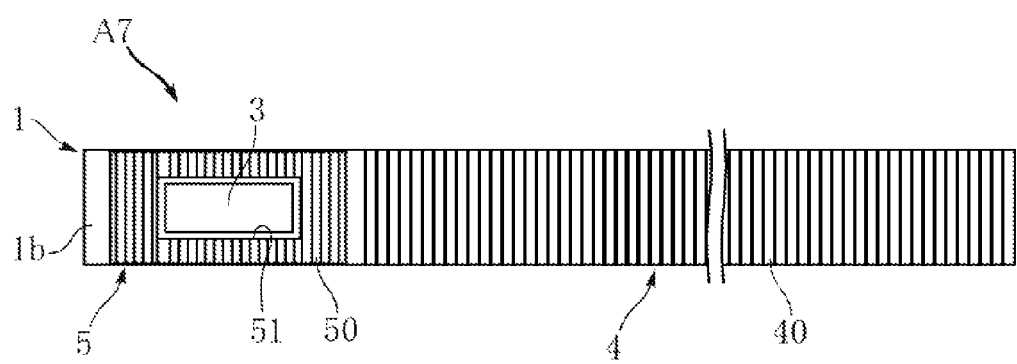
FIG. 14 is a bottom view of the LED module shown in FIG. 13.

FIGS. 13 and 14 show an LED module according to a seventh embodiment of the present invention. An LED module A7 of the present embodiment is different from those of the above embodiments in that the drive circuit chip 3 is arranged on the rear surface 1b. In the present embodiment, the drive circuit chip 3 is arranged toward one end of the rear surface 1b of the substrate 1. The second heat dissipator 5 is also arranged on the rear surface 1b. An opening 51 is formed in the second heat dissipator 5. The opening 51 is used as a space for housing the drive circuit chip 3. Accordingly, the second heat dissipator 5 has a shape surrounding the drive circuit chip 3.

With this embodiment as well, heat from the drive circuit chip 3 can be efficiently dissipated. Also, it is unnecessary to secure a space for the drive circuit chip 3 on the main surface 1a of the substrate 1. Therefore, more light emitting units 2 can be arranged on the main surface 1a, and thus the LED module of the present embodiment is suitable for high luminance.

Figure 15:
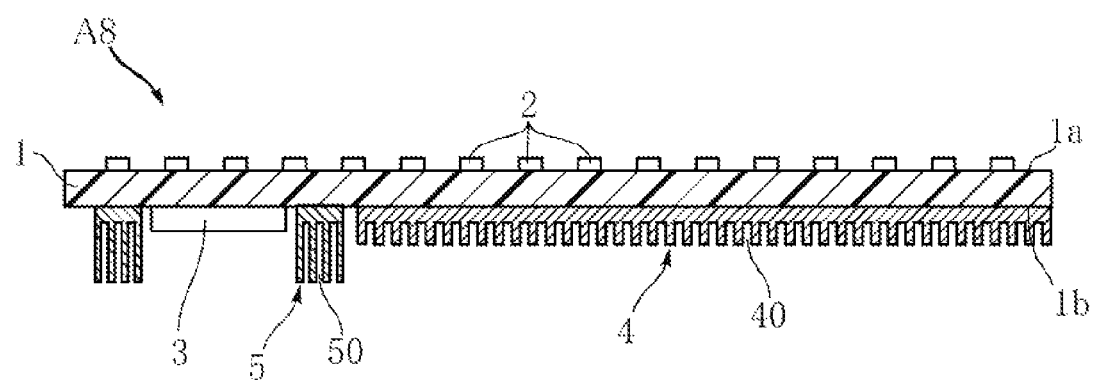
FIG. 15 is a cross-sectional view of an LED module according to an eighth embodiment of the present invention.
Figure 16:
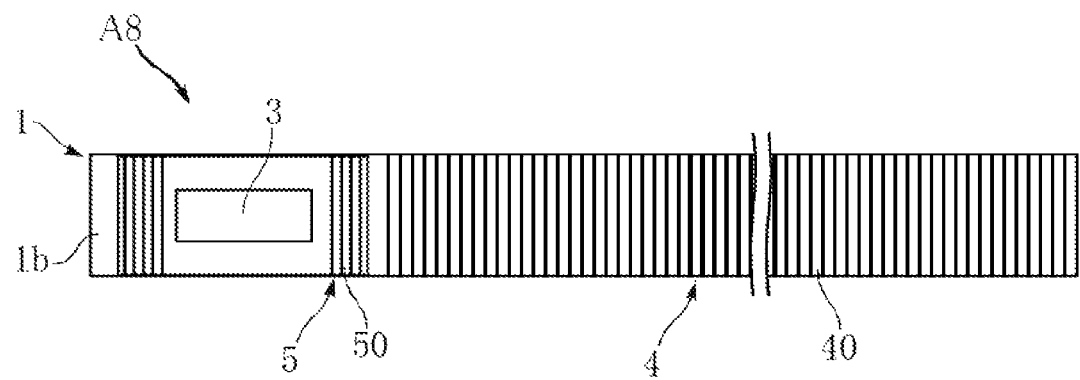
FIG. 16 is a bottom view of the LED module shown in FIG. 15.

FIGS. 15 and 16 show an LED module according to an eighth embodiment of the present invention. An LED module A8 of the present embodiment is different from the LED module A7 described above in that the second heat dissipator 5 has a two-piece structure. The second heat dissipator 5 is made up of two portions that are spaced apart from each other with the drive circuit chip 3 interposed therebetween. With this configuration as well, the same effects as those of the LED module A7 can be expected.

Figure 17:
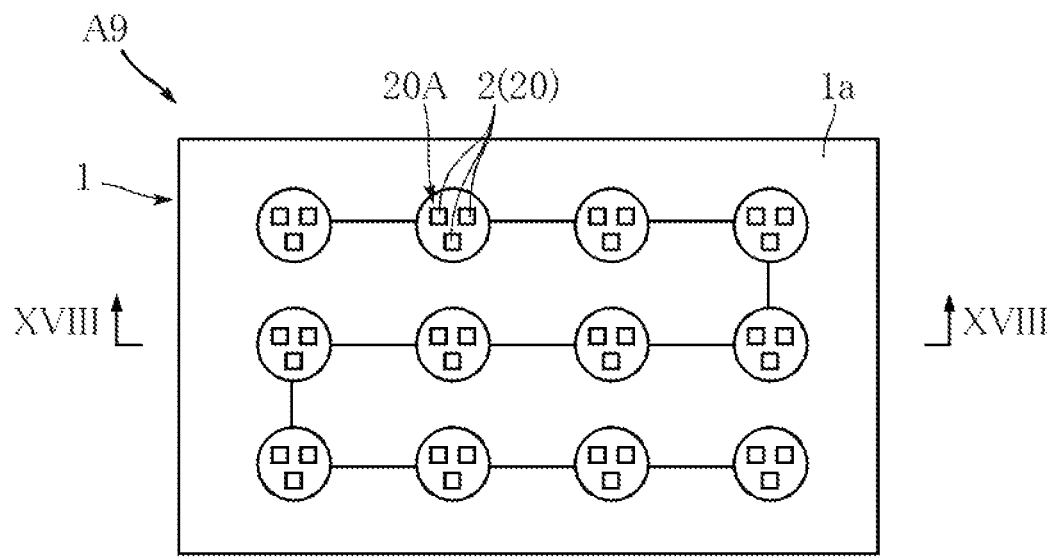
FIG. 17 is a plan view of an LED module according to a ninth embodiment of the present invention.
Figure 18:
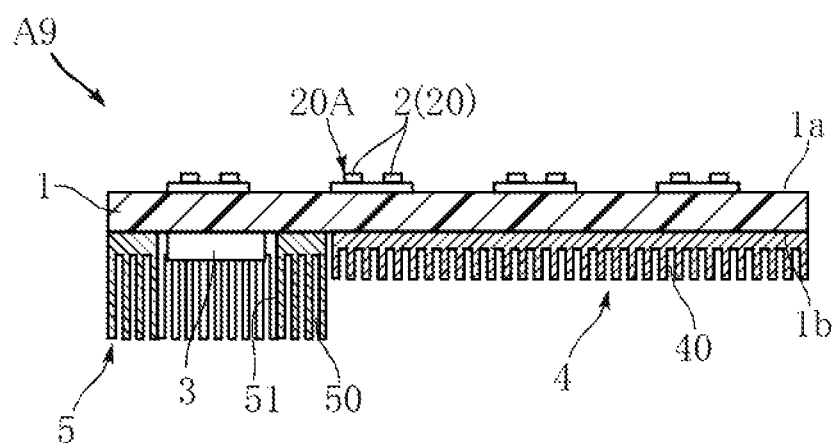
FIG. 18 is a cross-sectional view taken along the line XVIII-XVIII shown in FIG. 17.
Figure 19:
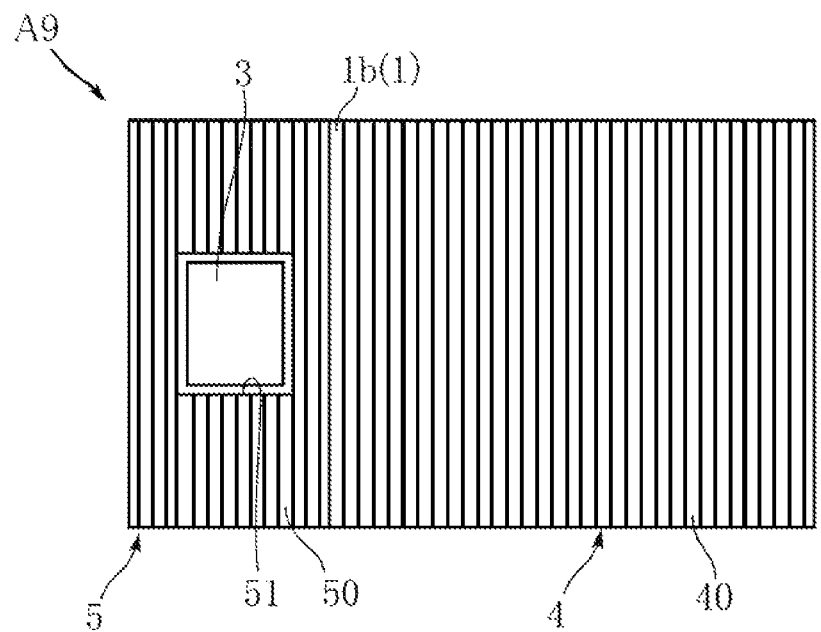
FIG. 19 is a bottom view of the LED module shown in FIG. 17.

FIGS. 17 to 19 show an LED module according to a ninth embodiment of the present invention. An LED module A9 of the present embodiment is different from those of the above embodiments in the shape of the substrate 1 and the arrangement of the light emitting units 2.

The substrate 1 has a rectangular shape. The light emitting units 2 are arranged such that three light emitting units 2 are arranged in close proximity to each other. Three LED chips 20 provided in the three light emitting units 2 arranged in close proximity to each other constitute an LED chip group 20A. As best shown in FIG. 17, a plurality of LED chip groups 20A are arranged in a matrix.

Figure 20:
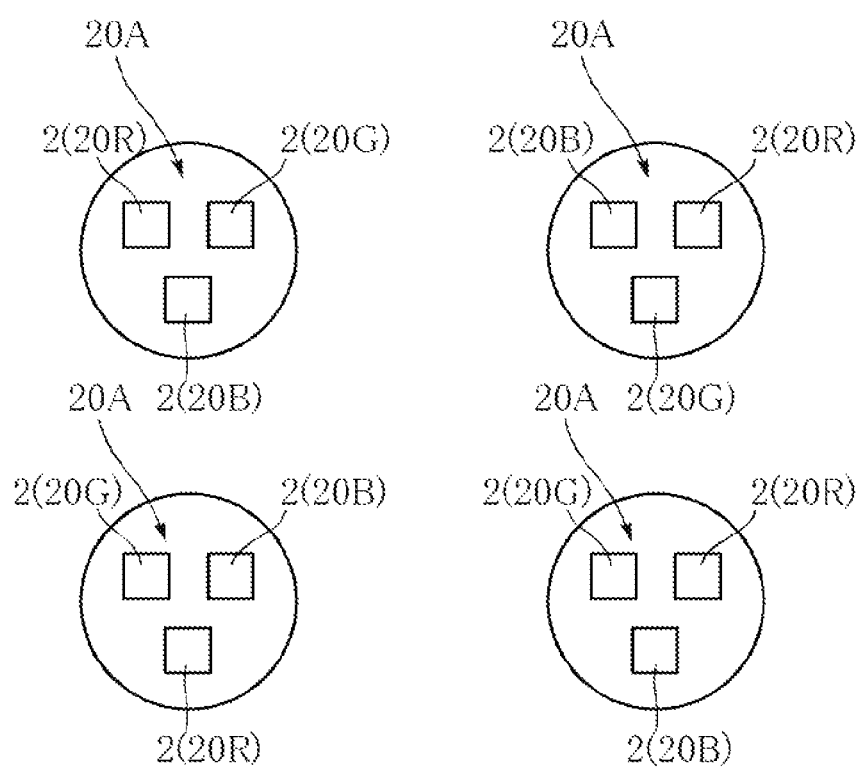
FIG. 20 is a plan view of a relevant part showing an arrangement of LED chips in the LED module shown in FIG. 17.

As shown in FIG. 20, each LED chip group 20A is constituted by a light emitting unit 2 including an LED chip 20R that emits red light, a light emitting unit 2 including an LED chip 20G that emits green light, and a light emitting unit 2 including an LED chip 20B that emits blue light, which are arranged in close proximity to each other. In each LED chip group 20A, the three LED chips 20R, 20G and 20B are arranged at positions corresponding to the vertices of a triangle. When adjacent LED chip groups 20A are compared, the relative positional relationship between the three LED chips 20R, 20G and 20B is different.

A drive circuit chip 3 of the present embodiment is arranged on the rear surface 1b of the substrate 1. The drive circuit chip 3 has a function of independently performing light modulation of the three color LED chips 20R, 20G and 20B. A configuration that is different from that of the present embodiment may be employed in which three drive circuit chips 3 that perform light modulation of the LED chips 20R, 20G and 20B, respectively is provided. As in the LED module A7 described above, the drive circuit chip 3 is surrounded by the second heat dissipator 5.

Figure 21:
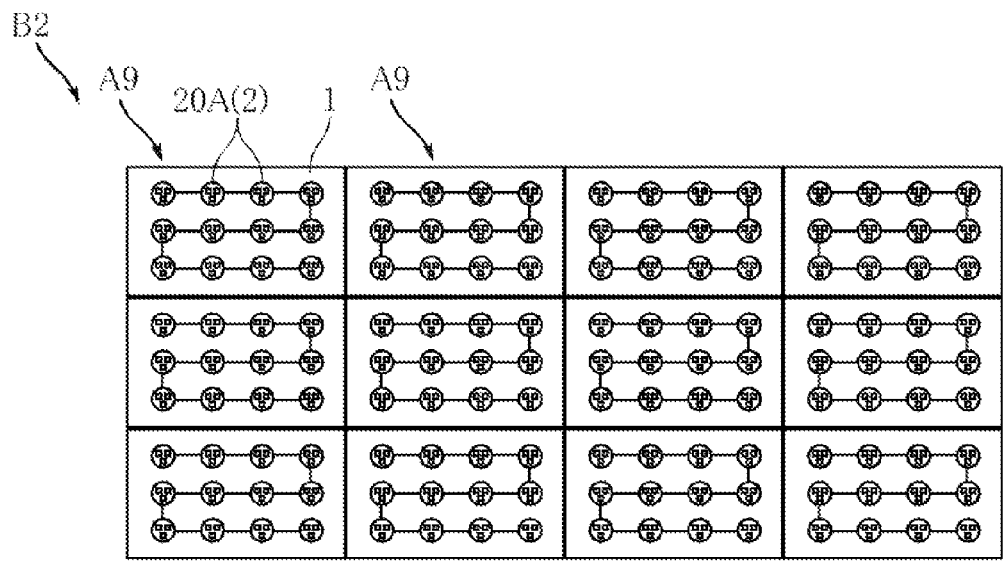
FIG. 21 is a plan view of an LED lighting device including a plurality of LED modules shown in FIG. 17.
Figure 22:
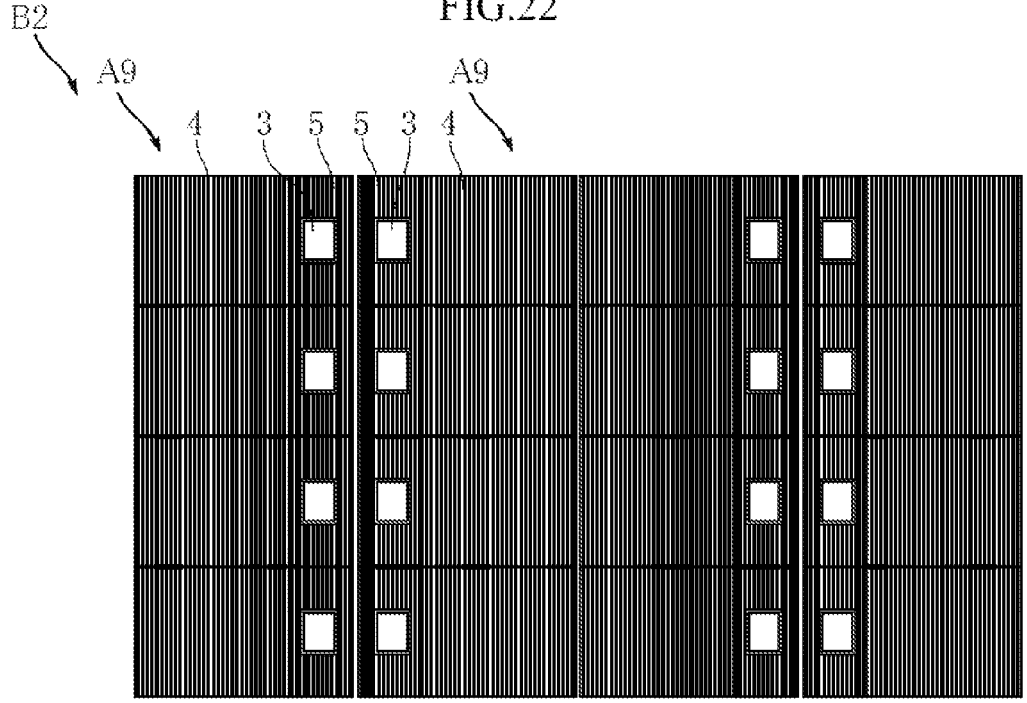
FIG. 22 is a bottom view of the LED lighting device shown in FIG. 21.
Figure 23:
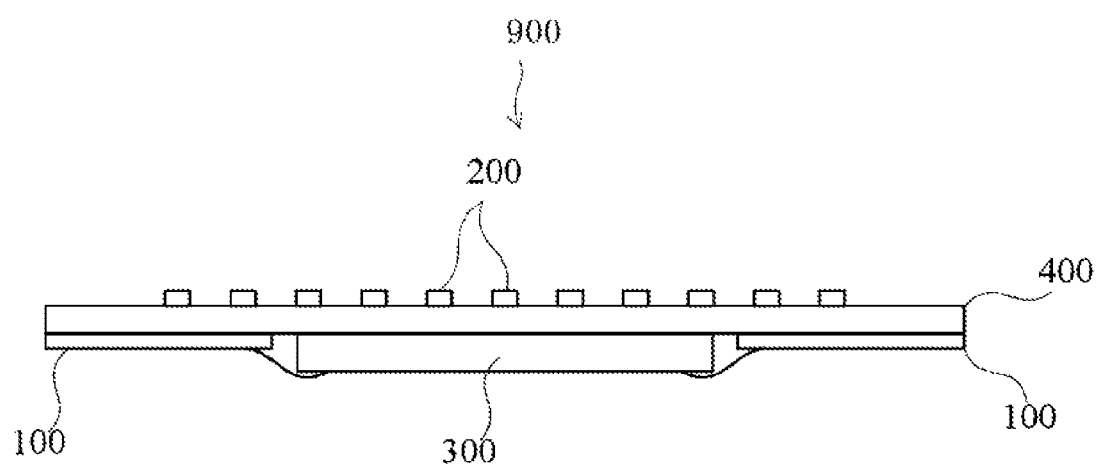
FIG. 23 is a side view of a conventional LED module.

FIGS. 21 and 22 show an example of an LED lighting device including a plurality of LED modules A9. An LED lighting device B2 of the present embodiment is configured such that a plurality of LED modules A9 are arranged in a matrix. As shown in FIG. 22, the drive circuit chips 3 provided in the LED modules A9 are arranged in rows along the top-to-bottom direction of the drawing. Also, the drive circuit chips 3 of adjacent LED modules A9 in the right-to-left direction of the drawing are arranged close to each other. Accordingly, the second heat dissipators 5 provided in the LED modules A9 are also arranged in rows. The LED lighting device B2 can be used as, for example, a backlight of a liquid crystal display apparatus.

According to this embodiment, the LED modules A9 can emit not only white light but also various colors of light by performing light modulation of each of red light, green light and blue light. The LED lighting device B2 can emit a different luminance and hue for each LED module A9 by individually controlling the luminance and hue of each LED module A9. Accordingly, for example, by performing light emission control of each LED module A9 according to the image displayed by a liquid crystal display apparatus in which the LED lighting device B2 is used as a backlight, sharp and contrast-rich images can be displayed.

By arranging the three LED chips 20R, 20G and 20B differently in adjacent LED chip groups 20A, the LED chips 20 that emit the same color of light can be arranged at unequal pitches. Unequal pitches are advantageous to avoid increase in interference of light beams emitted from the LED chips 20 of the same color.

The LED module and LED lighting device according to the present invention are not limited to the embodiments described above. The specific configuration of the components of the LED module and LED lighting device of the present invention can be designed and varied in various ways.

For example, as for the LED chips, they may be a plurality of different types of LED chips that emit RGB colors of light, and arranged in a plurality of rows in the longitudinal direction of the substrate. In the case where RGB color LED chips are used, the LED lighting device can be used as an electronic bulletin board or an image display apparatus, for example.

As a variation of the fifth embodiment or the sixth embodiment, a configuration may be employed in which the first and second heat dissipators are spaced apart in the longitudinal direction of the substrate.

The shape of the substrate is not limited to an elongated strip shape, and may be rectangular or circular.

The invention claimed is:

1. An LED module comprising:
a substrate including a main surface and a rear surface that are opposed to each other;
a plurality of LED chips arranged on the main surface of the substrate;
a drive circuit chip provided on the substrate for driving the plurality of LED chips;
a first heat dissipator that is provided on the rear surface of the substrate and that overlaps the plurality of LED chips as viewed in a thickness direction of the substrate; and
a second heat dissipator that is provided at a position closer to the drive circuit chip than the first heat dissipator is, and that has a thickness greater than that of the first heat dissipator,
wherein the drive circuit chip is arranged on the main surface of the substrate;
the second heat dissipator is provided on the rear surface of the substrate, and overlaps the drive circuit chip as viewed in the thickness direction of the substrate;
a wiring pattern for connecting the plurality of LED chips and the drive circuit chip to each other is formed on the main surface of the substrate;
a through-hole wiring connected to the wiring pattern is formed in the substrate;
a metal layer connected to the through-hole wiring is formed on the rear surface of the substrate; and
the second heat dissipator is in contact with the metal layer.

2. The LED module according to claim 1, wherein the first and second heat dissipators are spaced apart from each other.

3. The LED module according to claim 1, wherein the first and second heat dissipators are continuous with each other.

4. The LED module according to claim 1, wherein the closer a portion of the first heat dissipator is to the second heat dissipator, the greater the thickness of the portion is.

5. The LED module according to claim 1, wherein the first and second heat dissipators have a slit formed in the thickness direction of the substrate, and the slit of the second heat dissipator is deeper than the slit of the first heat dissipator.

6. The LED module according to claim 1, wherein the substrate has a strip shape, and the drive circuit chip is arranged toward one end in a longitudinal direction of the substrate.

7. The LED module according to claim 6, wherein the plurality of LED chips are aligned in the longitudinal direction of the substrate.

8. The LED module according to claim 6, wherein the LED chips emit white light.

9. The LED module according to claim 1, wherein the plurality of LED chips constitute a plurality of LED chip groups, each consisting of an LED chip that emits red light, an LED chip that emits green light and an LED chip that emits blue light.

10. The LED module according to claim 9, wherein the substrate has a rectangular shape, and the plurality of LED chip groups are arranged in a matrix.

11. The LED module according to claim 10, wherein in the LED chip groups adjacent to each other, a relative positional relationship between the LED chips that emit red light, green light and blue light is different.

12. An LED lighting device comprising a plurality of the LED modules according to claim 1, wherein the drive circuit chips provided in the LED modules are arranged in a row within the same plane.

13. An LED module comprising:
a substrate including a main surface and a rear surface that are opposed to each other;
a plurality of LED chips arranged on the main surface of the substrate;
a drive circuit chip provided on the substrate for driving the plurality of LED chips;
a first heat dissipator that is provided on the rear surface of the substrate and that overlaps the plurality of LED chips as viewed in a thickness direction of the substrate; and
a second heat dissipator that is provided at a position closer to the drive circuit chip than the first heat dissipator is, and that has a thickness greater than that of the first heat dissipator,
wherein the drive circuit chip is arranged on the main surface of the substrate;
the second heat dissipator is provided on the rear surface of the substrate, and overlaps the drive circuit chip as viewed in the thickness direction of the substrate;
a wiring pattern for connecting the plurality of LED chips and the drive circuit chip to each other is formed on the main surface of the substrate; and
the wiring pattern has a waist portion formed between the plurality of LED chips and the drive circuit chip.

14. An LED module comprising:
a substrate including a main surface and a rear surface that are opposed to each other;
a plurality of LED chips arranged on the main surface of the substrate;
a drive circuit chip provided on the substrate for driving the plurality of LED chips;
a first heat dissipator that is provided on the rear surface of the substrate and that overlaps the plurality of LED chips as viewed in a thickness direction of the substrate; and
a second heat dissipator that is provided at a position closer to the drive circuit chip than the first heat dissipator is, and that has a thickness greater than that of the first heat dissipator,
wherein the drive circuit chip is arranged on the rear surface of the substrate, and the second heat dissipator is arranged on the rear surface of the substrate and is adjacent to the drive circuit chip.

15. An LED module comprising:
a substrate including a main surface and a rear surface that are opposed to each other;
a plurality of LED chips arranged on the main surface of the substrate;
a drive circuit chip provided on the substrate for driving the plurality of LED chips;
a first heat dissipator that is provided on the rear surface of the substrate and that overlaps the plurality of LED chips as viewed in a thickness direction of the substrate; and
a second heat dissipator that is provided at a position closer to the drive circuit chip than the first heat dissipator is, and that has a thickness greater than that of the first heat dissipator,
wherein the drive circuit chip is arranged on the rear surface of the substrate, and the second heat dissipator is arranged on the rear surface of the substrate and has a shape surrounding the drive circuit chip.

* * * * *